United States Patent
Pergande

(10) Patent No.: US 11,109,452 B2
(45) Date of Patent: Aug. 31, 2021

(54) MODULAR LED HEATER

(71) Applicant: Applied Materials, Inc., Santa Clara, CA (US)

(72) Inventor: Paul E. Pergande, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 75 days.

(21) Appl. No.: 16/683,564

(22) Filed: Nov. 14, 2019

(65) Prior Publication Data

US 2021/0153303 A1    May 20, 2021

(51) Int. Cl.
*H05B 3/00* (2006.01)
*H05B 3/10* (2006.01)
*H01L 27/15* (2006.01)
*H01L 21/67* (2006.01)

(52) U.S. Cl.
CPC ......... *H05B 3/0047* (2013.01); *H01L 27/153* (2013.01); *H05B 3/10* (2013.01); *H01L 21/67115* (2013.01)

(58) Field of Classification Search
CPC ....... H05B 3/0047; H05B 3/10; H01L 27/153; H01L 21/67115
See application file for complete search history.

(56) References Cited

U.S. PATENT DOCUMENTS

| | | |
|---|---|---|
| 6,818,864 B2 | 11/2004 | Ptak |
| 9,287,148 B1 | 3/2016 | Evans et al. |
| 9,666,769 B2 | 5/2017 | Osaki et al. |
| 10,028,336 B2 | 7/2018 | Aoyama et al. |
| 10,600,662 B2 | 3/2020 | Pergande |
| 2008/0063809 A1 | 3/2008 | Lee et al. |
| 2010/0038833 A1 | 2/2010 | Kasai et al. |

(Continued)

FOREIGN PATENT DOCUMENTS

| | | |
|---|---|---|
| JP | 2008-16691 A | 1/2008 |
| JP | 2014-191916 A | 10/2014 |

(Continued)

OTHER PUBLICATIONS

International Search Report and Written Opinion dated Oct. 29, 2019 in co-pending PCT application No. PCT/US2019/041286.

(Continued)

*Primary Examiner* — John P. Dulka
(74) *Attorney, Agent, or Firm* — Nields, Lemack & Frame, LLC

(57) ABSTRACT

A modular LED heater and an LED array are disclosed. The modular LED heater comprises a base having one or more internal conduits through which a coolant fluid may flow. The base also includes a plumbing port on one side wall of the base and a recessed port on an opposite side of the base. These ports are configured such that the plumbing port of one modular LED heater can be inserted into the recessed port of the adjacent modular LED heater to form a fluid-tight seal. A printed circuit board having a plurality of LEDs is disposed on the front surface of the base. Further, in some embodiments, the base includes one or more wedge clamps on its side walls used to lock the modular LED heater to an adjacent modular LED heater. An LED array may be created by assembling a plurality of these modular LED heaters.

20 Claims, 10 Drawing Sheets

(56) References Cited

U.S. PATENT DOCUMENTS

| | | |
|---|---|---|
| 2012/0325795 A1* | 12/2012 | Suzuki .............. H01L 21/67115 219/209 |
| 2013/0326941 A1 | 12/2013 | Pickett et al. |
| 2015/0023385 A1 | 1/2015 | Patalay et al. |
| 2016/0293458 A1 | 10/2016 | Schaller et al. |
| 2016/0329458 A1 | 11/2016 | Evans et al. |
| 2017/0105320 A1 | 4/2017 | Park |
| 2019/0318946 A1 | 10/2019 | Kim |

FOREIGN PATENT DOCUMENTS

| | | |
|---|---|---|
| KR | 10-2011-0030292 A | 3/2011 |
| WO | 2008/030663 A1 | 3/2008 |

OTHER PUBLICATIONS

Office action dated Sep. 18, 2019 in co-pending U.S. Appl. No. 16/040,661.
Notice of allowance dated Jan. 21, 2020 in co-pending U.S. Appl. No. 16/040,661.
International Search Report and Written Opinion dated Feb. 2, 2021 in corresponding PCT application No. PCT/US2020/056801.

* cited by examiner

MODULAR LED HEATER

FIELD

Embodiments of the present disclosure relate to systems for heating a substrate, and more particularly, to a modular LED heater, having electrical and plumbing connections that may be used as part of an LED array.

BACKGROUND

The fabrication of a semiconductor device involves a plurality of discrete and complex processes. In certain processes, it may be advantageous to heat the substrate so that the process achieves the desired result. One method of heating the substrate is through the use of arrays of light emitting diodes (LEDs).

In some embodiments, these LED arrays may be very large, such as up to 8,000 light emitting diodes. Since each diode has two connections to the printed circuit board, a total of functional 8,000 diodes and 16,000 perfect solder connections are needed to yield a fully functioning LED array. However, it is common for a fraction, such as 1-2%, of the LEDs to be nonfunctional. Reworking these arrays to replace a faulty LED or correct a solder bridge is nontrivial and time consuming. Further, it is costly to replace an entire array, given the number of LEDs that are disposed on each array.

Additionally, the illumination output tolerance of the LEDs is typically ±2%. Thus, creating an array with good thermal uniformity may be difficult, given the variation in illumination patterns.

Therefore, it would be advantageous if there were a more cost effective and more reliable LED array. It would be beneficial if the new LED array alleviated the issues cited above.

SUMMARY

A modular LED heater and an LED array are disclosed. The modular LED heater comprises a base having one or more internal conduits through which a coolant fluid may flow. The base also includes a plumbing port on one side wall of the base and a mating recessed port on an opposite side of the base. These ports are configured such that the plumbing port of one modular LED heater can be inserted into the recessed port of the adjacent modular LED heater to form a fluid-tight seal. A printed circuit board having a plurality of LEDs is disposed on the front surface of the base. Further, in some embodiments, the base includes one or more wedge clamps on its side walls used to lock the modular LED heater to an adjacent modular LED heater. An LED array may be created by assembling a plurality of these modular LED heaters.

According to one embodiment, a modular light emitting diode (LED) heater is disclosed. The modular LED heater comprises a base having a conduit for coolant fluid to pass through, the conduit in communication with a plumbing port and a recessed port; a printed circuit board disposed on a front surface of the base comprising a plurality of LEDs; and power feedthroughs, passing through the base and in communication with the printed circuit board to supply power to the LEDs. In certain embodiments, the printed circuit board comprises a metal clad printed circuit board. In some embodiments, a top side of the conduit is a bottom surface of the metal clad printed circuit board. In certain embodiment, the modular LED heater comprises a flex circuit disposed on a back surface of the base and in electrical communication with the power feedthroughs. In certain embodiments, the plurality of LEDs are separated into a plurality of zones, wherein each zone is powered by a dedicated power source. In certain embodiments, the base is hexagonal. In some embodiments, wedge clamps are disposed on at least one side wall of the base to lock the modular LED heater to an adjacent modular LED heater. In a further embodiment, the at least one side wall comprises a screw channel, and the wedge clamp comprises: a first screw holder having a protrusion and a through hole; a second screw holder having a protrusion and a tapped hole; and a screw passing through the first screw holder and screwed into the second screw holder, wherein tightening of the screw locks the wedge clamp. In a further embodiment, the modular LED heater comprises vertical pins disposed in the screw channel, wherein tightening of the screw presses the protrusions against the vertical pins to lock the wedge clamp.

According to another embodiment, a LED array is disclosed. The LED array comprises a plurality of modular LED heaters, which are nested together, wherein each modular LED heater comprises: a base having a conduit for coolant fluid to pass through, the conduit in communication with a plumbing port and a recessed port; a printed circuit board disposed on a front surface of the base comprising a plurality of LEDs; and power feedthroughs, passing through the base and in communication with the printed circuit board to supply power to the LEDs; wherein the plumbing port of a modular LED heater enters the recessed port of an adjacent modular LED heater and forms a fluid-tight seal, wherein the modular LED heater and the adjacent modular LED heater form a fluid path. In certain embodiments, each modular LED heater comprises a wedge clamp disposed on at least one side wall of the base to lock each modular LED heater to an adjacent modular LED heater. In some embodiments, the LED array comprises a flex circuit disposed on a rear surface of the LED array, wherein each power feedthrough is in communication with the flex circuit. In certain embodiments, the LED array comprises a plurality of fluid paths, each fluid path comprising at least one modular LED heater through which coolant fluid passes. In some embodiments, the LED array comprises a first header and a second header, wherein the first header comprises an external plumbing port and a plurality of internal ports, wherein each internal port is in communication with a respective one of the plurality of fluid paths to supply coolant fluid to each fluid path, and wherein the second header comprises an external plumbing port and a plurality of internal ports, wherein each internal port is in communication with a respective one of the plurality of fluid paths to receive coolant fluid from each fluid path. In some embodiments, the plurality of modular LED heaters are identical in size and shape.

According to another embodiment, a processing chamber is disclosed. The processing chamber comprises a workpiece support to hold a workpiece; a LED array disposed in the processing chamber, the LED array comprising: a plurality of modular LED heaters; wherein each of the plurality of modular LED heaters comprises: a base having a conduit for coolant fluid to pass through, the conduit in communication with a plumbing port and a recessed port, wherein the plumbing port of a modular LED heater enters the recessed port of an adjacent modular LED heater and forms a fluid-tight seal, wherein the modular LED heater and the adjacent modular LED heater form a fluid path; a printed circuit board disposed on a front surface of the base comprising a plurality of LEDs; and power feedthroughs, passing through the base and in communication with the printed circuit board to supply power to the LEDs; and a cooler in communication with each fluid path to remove heat from the coolant fluid as it exits the LED array and recirculate the coolant fluid. In certain embodiments, the LED array comprises a first header, wherein the first header comprises an external plumbing port and a plurality of internal ports, wherein the external plumbing port is in communication with the cooler and each internal port is in communication with a respective one of the plurality of fluid paths to supply coolant fluid to each fluid path; and a second header, wherein the second header comprises an external plumbing port and a plurality of internal ports, wherein the external plumbing port is in communication with the cooler and each internal port is in communication with a respective one of the plurality of fluid paths to receive coolant fluid from each fluid path. In certain embodiments, the processing chamber further comprises a flex circuit in electrical communication with each of the power feedthroughs and a power controller in electrical communication with the flex circuit, wherein the power controller controls power supplied to the LEDs in each modular LED heater. In some embodiments, each of the plurality of modular LED heaters is calibrated and a power output map is generated for each of the plurality of modular LED heaters and the power controller uses the power output maps to control the power supplied to each modular LED heater. In certain further embodiments, a plurality of power output maps are generated for each modular LED heater, and the power controller uses a temperature of the modular LED heater and the power output maps to control the power supplied to each modular LED heater.

BRIEF DESCRIPTION OF THE FIGURES

For a better understanding of the present disclosure, reference is made to the accompanying drawings, which are incorporated herein by reference and in which.

DETAILED DESCRIPTION

As described above, large LED arrays are used to heat workpieces, such as silicon wafers. Thermal uniformity of the LED array is a goal, as differences in thermal uniformity may affect semiconductor processing yield.

To overcome the issues noted above, the present disclosure divides the LED array into a plurality of modular LED heaters. Each of these modular LED heaters is independently fabricated and tested. Further, each of these modular LED heaters has its own respective electrical connections. The modular LED heaters also include plumbing connections to allow each modular LED heater to be cooled by a fluid, such as cool water.

Figure 1A:
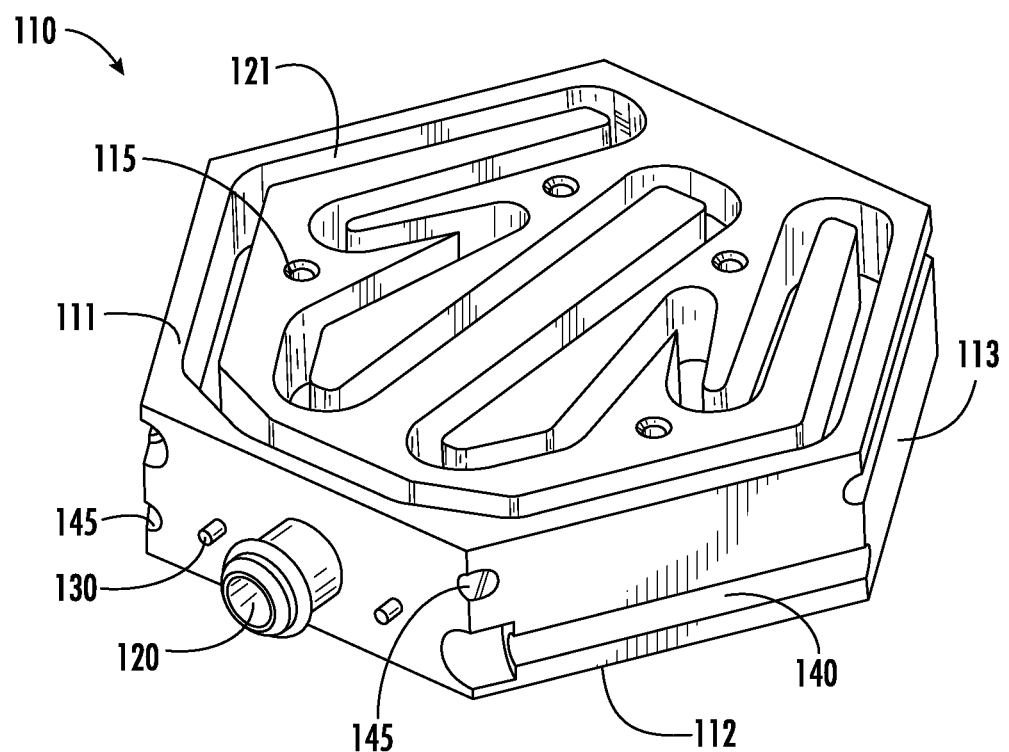
FIG. 1A-1B show a first embodiment of a base that can be used to form the modular LED heater.
Figure 1B:
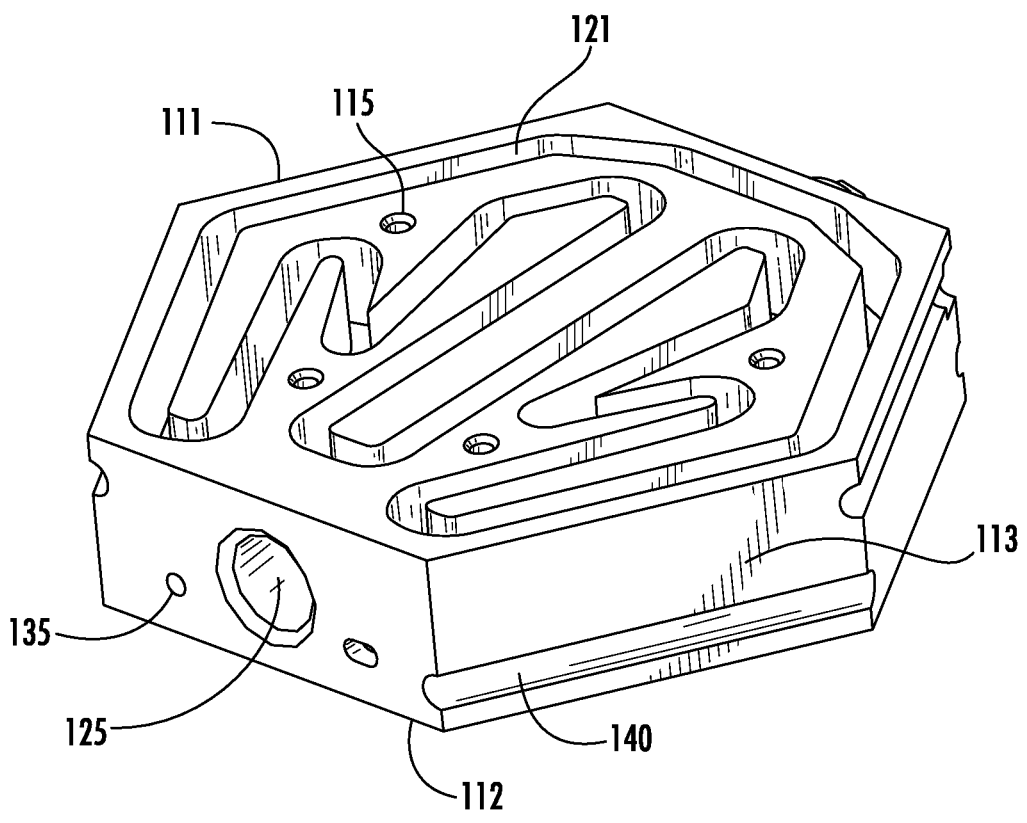

FIG. 1A shows a first view of one embodiment of the base 110 of a modular LED heater according to one embodiment. FIG. 1B shows the same embodiment viewed from behind the base 110. The base 110 may be any shape that is suitable for nesting. For example, shapes such as rectangles, hexagons, octagons, may be used. In FIG. 1, a hexagonal shape is shown. Thus, in this embodiment, the base 110 has a front surface 111, a bottom surface 112, and six side walls 113. Of course, other shapes may have a different number of side walls. The base 110 includes one or more conduits 121 passing through the interior of the base. For example, the base 110 may have a plumbing port 120, extending outward from one of the side walls 113. This plumbing port 120 is used for the passage of coolant fluid through the conduit 121 in the base 110. On an opposite side wall of the base, a mating recessed port 125 (as shown in FIG. 1B) is included. The plumbing port 120 and the mating recessed port 125 are configured such that when two bases 110 are disposed adjacent to one another, the plumbing port 120 of one base 110 aligns with the mating recessed port 125 of the adjacent base 110, such that the plumbing port 120 enters the recessed port, forming a fluid-tight connection. This fluid-tight connection may be created using, for example, one touch fittings or bore seals.

In certain embodiments, the side wall 113 that includes the plumbing port 120 may also include one or more alignment pins 130. Corresponding alignment slots 135 may be disposed on the side wall 113 that includes the mating recessed port 125. Of course, the alignment pins 130 may be disposed on the side wall 113 with the recessed port 125 with the alignment slots on the side wall 113 having the plumbing port 120.

Additionally, there may be one or more vertical channels 115 that pass from the front surface 111 to the bottom surface 112. These vertical channels 115 may be used to pass electrical signals, such as power and ground to the printed circuit board that is disposed on the front surface 111 of the base, as described in greater detail below.

By including plumbing ports 120 and recessed ports 125, a plurality of bases 110 may be arranged in a serial manner, such that the coolant fluid flows through the conduits 121 of several bases 110. Using this technique, the number of plumbing pipes and connections to the LED array may be reduced. As shown in FIGS. 1A-1B, in one embodiment, the conduits 121 may flow in a serpentine pattern through the interior of the base 110. Of course, other shapes are also possible. In certain embodiments, the conduits 121 have a diameter of between 0.1 and 0.5 inches. The coolant fluid may be water or another cooled liquid or gas.

Figure 2:
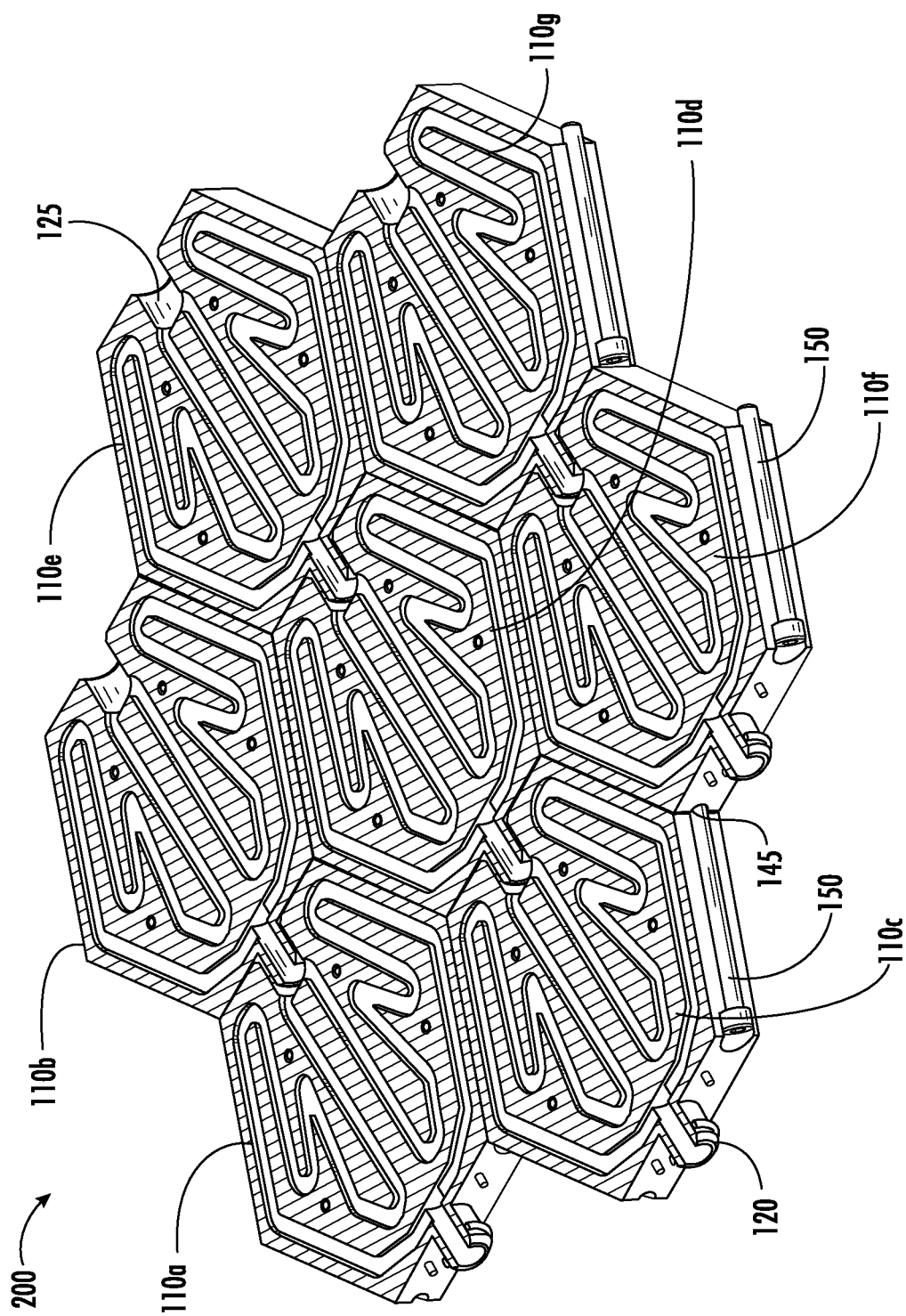
FIG. 2 shows an LED array constructed from a plurality of the bases from FIG. 1A.

As stated above, the base 110 is designed to support the nesting of adjacent bases such that the plumbing connections from one base 110 attach to an adjacent base. Thus, external plumbing attachments are only employed at the two ends of a plurality of interconnected bases. For example, FIG. 2 shows a LED array 200 constructed from a plurality of bases 110. In this embodiment, the modular LED heaters 100 are identical in size and shape. Of course, differently sized and/or shaped modular LED heaters 100 may be used to create the LED array 200.

In the embodiment of FIG. 2, three fluid paths are defined. One fluid path is through bases 110a, 110b. A second fluid path is through bases 110*c*, 110*d*, 110*e*. The third fluid path is through bases 110*f*, 110*g*. Thus, in this embodiment, there are three plumbing ports 120 and three mating recessed ports 125 that utilize external connections.

In one embodiment, these three fluid streams are in parallel. In other words, there is a coolant fluid source connected to the plumbing ports of bases 110*a*, 110*c*, 110*f* such that the coolant fluid source provides coolant directly to each of these fluid streams. In this embodiment, a fluid sink attached to the recessed ports of bases 110*b*, 110*e*, 110*g*.

In yet another embodiment, the fluid paths may be connected to form a single fluid stream. For example, a first external connector may be used to connect the recessed port of base 110*b* with the recessed port of base 110*e*. A second external connector may be used to connect the plumbing port 120 of base 110*c* with the plumbing port 120 of base 110*f*. In this embodiment, only one fluid sink is used and is connected to the recessed port of base 110*g*. In this embodiment, the bases 110 may be arranged such that the plumbing ports 120 of different fluid streams are oriented in an alternating fashion. In the way, the recessed port of base 110*b* would connect to the plumbing port 120 of base 110*e*.

There are a variety of mechanisms that may be used to connect the various bases 110 together. FIGS. 1A-1B and 2 show a first embodiment. In this embodiment, a screw channel 140 is created in one or more side walls 113. In certain embodiments, screw channels 140 are disposed in a plurality of the side walls 113. To allow this, the screw channels 140 may be disposed at different heights. For example, FIG. 1B shows two screw channels 140 on two adjacent side walls 113, disposed at different heights. The screw channel 140 in each base 110 may be a semi-circular channel, where a mating semi-circular screw channel 140 is disposed on the adjacent base 110. For example, referring to FIG. 2, bases 110*d* and 110*f* may each comprise a screw channel 140 at the same height, such that when the bases are placed adjacent to one another, there is a hollow cylinder through which a clamp screw 150 may pass. One end of the screw channel 140 may include a larger radius to accommodate the head of the clamp screw 150. For example, FIG. 2 shows clamp screws 150 disposed in a plurality of screw channels 140. The base 110 may also include one or more tapped holes 145. The distal end of each of the clamp screws 150 screws into a corresponding tapped hole 145. This can be seen on base 110*f* of FIG. 2.

Figure 3A:
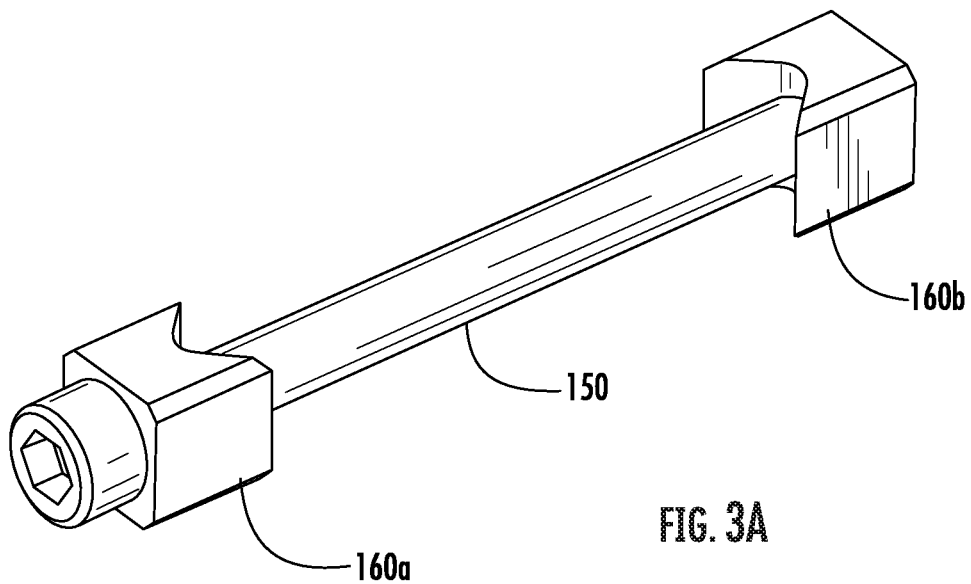
FIG. 3A shows a clamp.
Figure 3B:
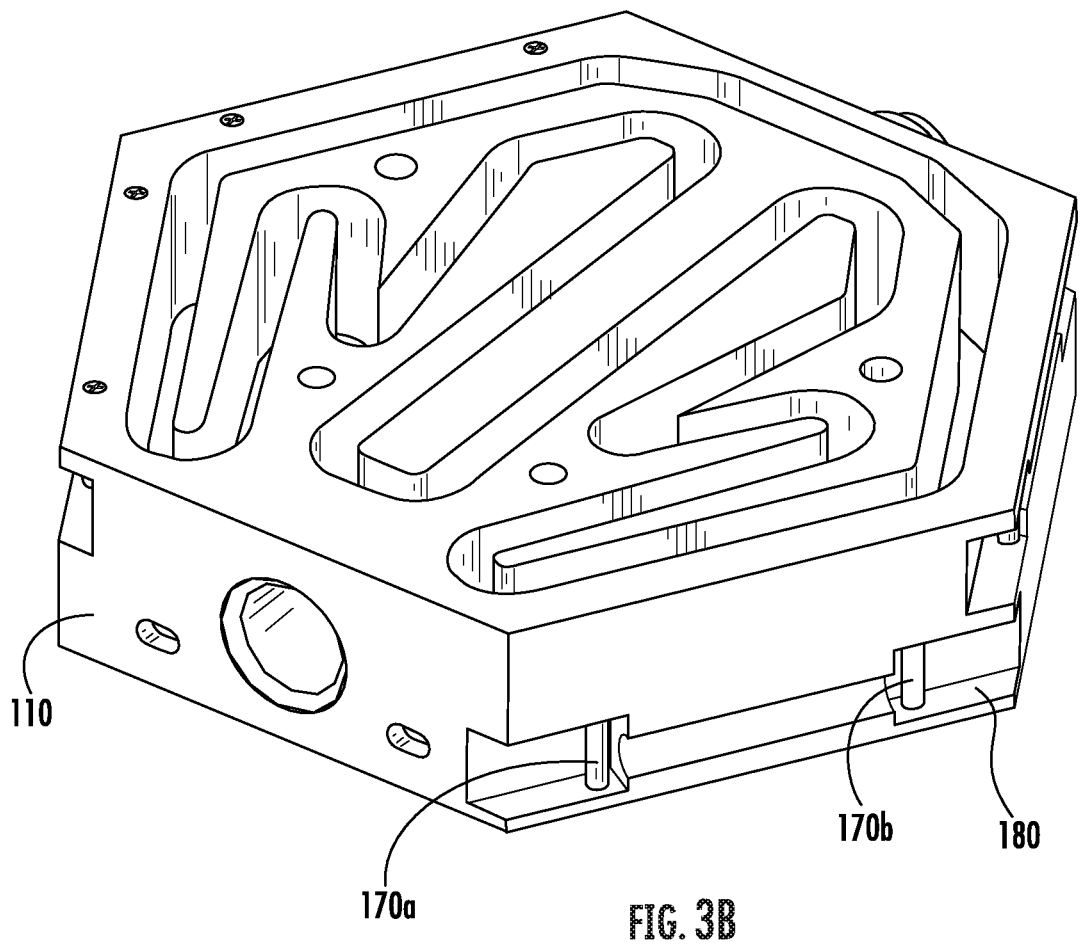
FIG. 3B show a second embodiment of the base that uses the clamp of FIG. 3A.

FIGS. 3A-3B shows another embodiment of the base 110 that may be used to attach the bases 110 together to form an array. In this embodiment, as shown in FIG. 3A, there is a first screw holder 160*a* and a second screw holder 160*b* for each clamp screw 150. The first screw holder 160*a* has a clearance hole, while the second screw holder 160*b* has a tapped hole. Thus, the clamp screw 150 is able to pass through the first screw holder 160*a* and is screwed into the second screw holder 160*b*. As the clamp screw 150 is tightened, the two screw holders are pulled together.

FIG. 3B shows one embodiment of a base 110 that can employ the screw holders of FIG. 3A. In this embodiment, two pins 170*a*, 170*b* are vertically disposed in the screw channel 180. The screw channel 180 is dimensioned such that the first screw holder 160*a* may be installed in the screw channel 180 in front of the first pin 170*a*. Similarly, the screw channel 180 is dimensioned such that the second screw holder 160*b* may be installed in the screw channel 180 behind the second pin 170*b*. The adjacent base 110 has an identical configuration. The screw holders 160*a*, 160*b* each comprise protrusions which are configured to extend into the gap between the respective pin and the base 110. In certain embodiments, the screw holder 160*a*, 160*b* may have a "C" or "V" shape.

Thus, to assemble, the second screw holder 160*b* is inserted into the screw channel 180 behind the second pin 170*b* of one base 110. A second base is then brought adjacent to the first base so that the second screw holder 160*b* is also behind the second pin 170*b* of the second base. The first screw holder 160*a* is then slid into the screw channel 180. The clamp screw 150 is then inserted through the first screw holder 160*a* and into the second screw holder 160*b*. When the clamp screw 150 is tightened, the protrusions on the first screw holder 160*a* and the second screw holder 160*b* are pressed against their respective pins 170, forming a wedge clamp.

In other embodiments, the side wall 113 may be formed to have recesses against which the protrusions of the screw holders are pressed to lock the wedge clamp in place.

Figure 4:
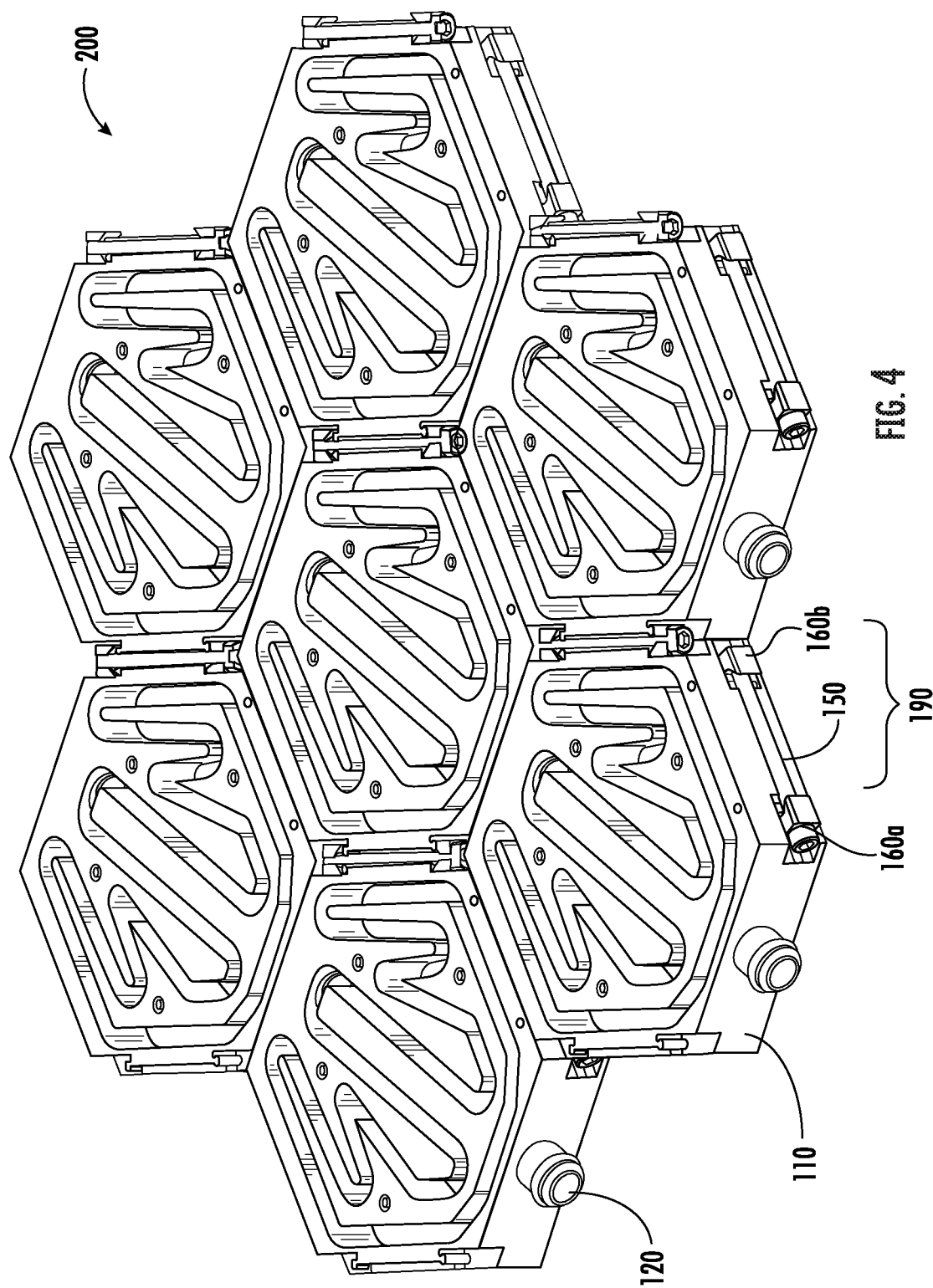
FIG. 4 shows an LED array constructed from a plurality of the bases from FIG. 3B.

FIG. 4 shows a plurality of bases 110 connected using wedge clamps 190. As described above, the wedge clamp 190 comprises a plurality of screw holders 160*a*, 160*b* and clamp screws 150. The screw channels 180 are also configured to ensure that the screw holders 160*a*, 160*b* have a surface that can be clamped to. In certain embodiments, as described above, pins 170*a*, 170*b* may be disposed in the screw channel 180 to provide this surface. In other embodiments, the screw channel 180 may be formed to have such a surface.

FIGS. 1-4 show the mechanical interconnections between adjacent bases 110 that allow fluid to pass through a plurality of bases 110 and also allows the bases 110 to be joined to form an array.

Figure 5A:
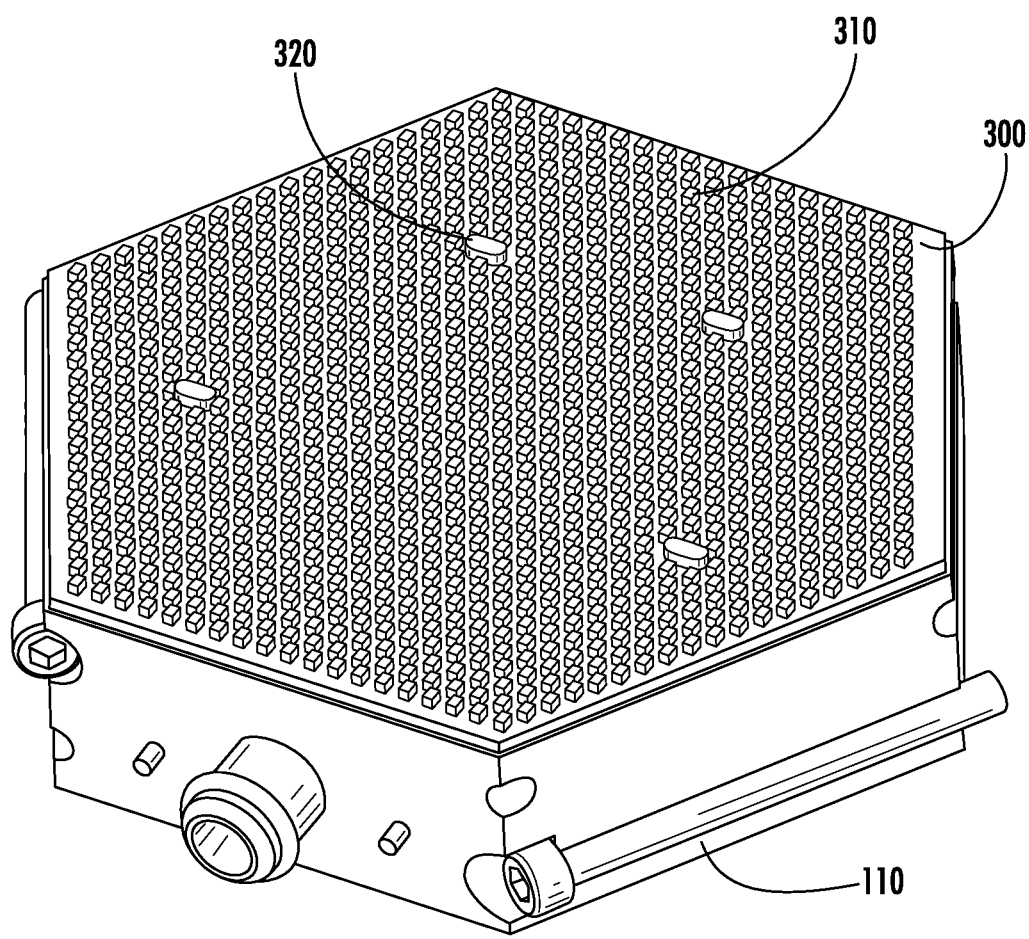
FIGS. 5A-5B show views of the modular LED heater created using the base from FIG. 1A.
Figure 5B:
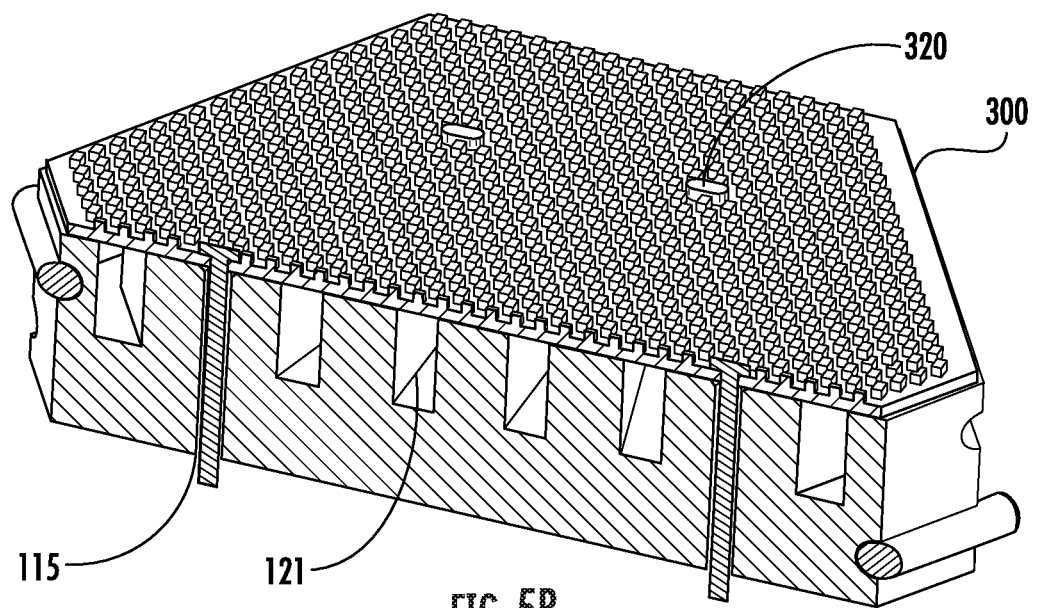

FIG. 5A shows the modular LED heater 100 of FIG. 1A with a printed circuit board 300 disposed on the front surface 111 of the base 110. FIG. FIG. 5B is a cross-sectional view of the modular LED heater 100 of FIG. 5A.

In certain embodiments, the printed circuit board 300 is a metal clad printed circuit board. A metal clad printed circuit board has conductive traces disposed on the front side of a dielectric layer. A metal layer is bonded to the back side of the dielectric layer. Thus, no conductive traces can be disposed on the back side of the dielectric layer. In this embodiment, the back surface of the printed circuit board 300 is a metal, such as aluminum or copper. In certain embodiments, the back surface of the printed circuit board 300 may be soldered to the front surface 111 of the base 110 using a solder with a lower melting point than the solder used for the connections on the printed circuit board 300. Alternatively, a thermal paste may be disposed between the printed circuit board 300 and the front surface 111 of the base 110. In this embodiment, the top side of the conduit 121 is the back surface of the printed circuit board 300, which provides an excellent thermal path to the coolant fluid. In other words, the back surface of the printed circuit board 300 serves as one of the walls of the conduit 121. In other embodiments, the conduit 121 may be embedded in the base 110.

In another embodiment, the front surface 111 of the base 110 may comprises threaded holes. In this way, the printed circuit board 300 may be fastened to the base 110, such as through the use of screws that attach to the threaded holes in the front surface 111 of the base 110. This may provide thermal conductivity between the printed circuit board 300 and the base 110. The thermal conductivity may be further improved by introducing a thermal paste or adhesive between the back surface of the printed circuit board and the front surface of the base 110.

A plurality of LEDs 310 are disposed on the front surface of the printed circuit board 300. In certain embodiments, each printed circuit board 300 may have between 250 and 1000 LEDs 310, although the number of LEDs is not limited by this disclosure. In certain embodiments, each LED 310 may be a high power LED, which emits light of a wavelength or a plurality of wavelengths that is readily absorbed by the workpieces. For example, silicon exhibits high absorptivity and low transmissivity in the range of wavelengths between about 0.4 and 1.0 μm. Silicon absorbs more than 50% of the energy emitted in the range of wavelengths from 0.5 to 1.0 μm. LEDs that emit light in this range of wavelengths may be used. In certain embodiments, LEDs made from GaN are employed. These GaN LEDs emit light at a wavelength of about 450 nm. In certain embodiments, GaP LEDs are employed, which emit light at a wavelength between 610 and 760 nm.

The LEDs 310 may be varied in size. In certain embodiments, each LED 310 may be 1.3 mm×1.7 mm. In another embodiment, each LED 310 may be 1 mm×1 mm. Of course, LEDs of other dimensions are also within the scope of the disclosure. The LEDS may be traditional packaged die, bare die, or flip chip die.

Each LED 310 may consume up to 3 W. Therefore, a printed circuit board 300 having 500 LEDs 310 may consume 1.5 kw.

In certain embodiments, the LEDs 310 may be arranged in a rectangular pattern, such that there are a number of rows, each with a plurality of LEDs 310. The spacing between any two adjacent LEDs in a given row may be equal, except for deviations caused by the power feedthroughs. Additionally, there may be a plurality of columns, where each column is a row of LEDs 310. The spacing between any two adjacent columns may also be equal. Because the base 110 may be hexagonal, the number of LEDs 310 in each row may not be equal, as can be seen in FIG. 1.

In certain embodiments, all of the LEDs 310 are connected to a common power source. In this way, the current passing through each LED 310 is equal. In other embodiments, the LEDs 310 may be separated into a plurality of zones, where each zone is connected to a respective power source. In this way, the current passing through LEDs of different zones may be different, resulting is a difference in illumination between the zones. For example, the LEDs 310 that are closer to the side walls 113 may be in a first zone, while the LEDs 310 closer to the center of the printed circuit board 300 may be in a second zone. The number and configuration of zones is not limited by this disclosure.

As stated above, the printed circuit board 300 may be a metal clad printed circuit board, where the bottom surface of the printed circuit board is a metal. Thus, to electrically connect to the traces on the front surface of the dielectric layer, power feedthroughs 320 are provided on the top surface of the printed circuit board 300. In other words, there may be holes in the printed circuit board 300 that allow wires or other conduits to pass to the top surface of the printed circuit board 300. The power feedthroughs 320 for each printed circuit board 300 may include a common ground feedthrough and one or more voltage feedthroughs, one for each zone in the printed circuit board 300. As shown in FIG. 5B, the power feedthroughs 320 pass through vertical channels 115 from the printed circuit board 300 to the bottom surface 112 of the base 110.

Figure 6:
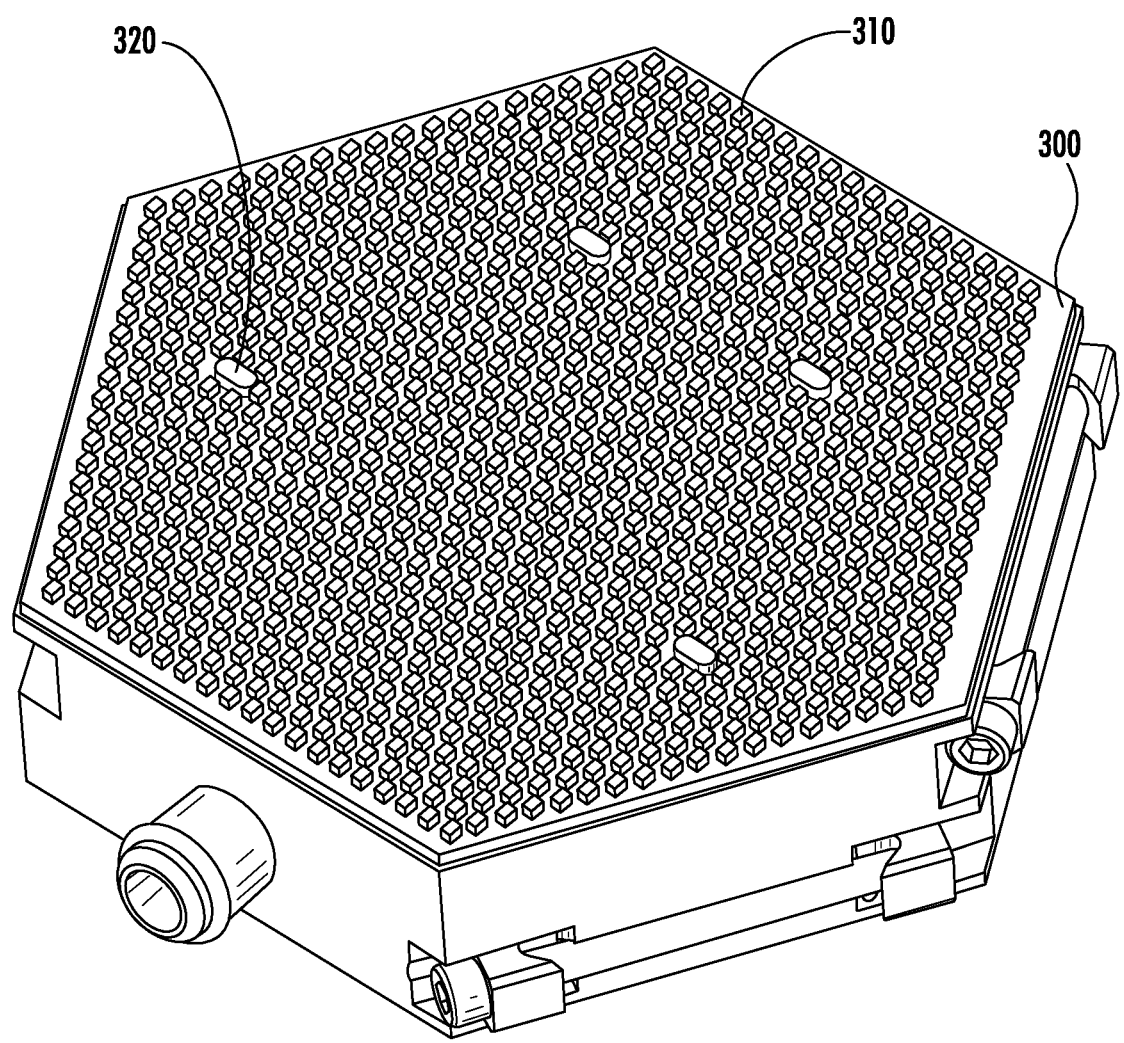
FIG. 6 show the modular LED heater created using the base from FIG. 3B.

FIG. 6 shows the base 110 of FIG. 3B with a printed circuit board 300 disposed on its top surface.

Figure 7:
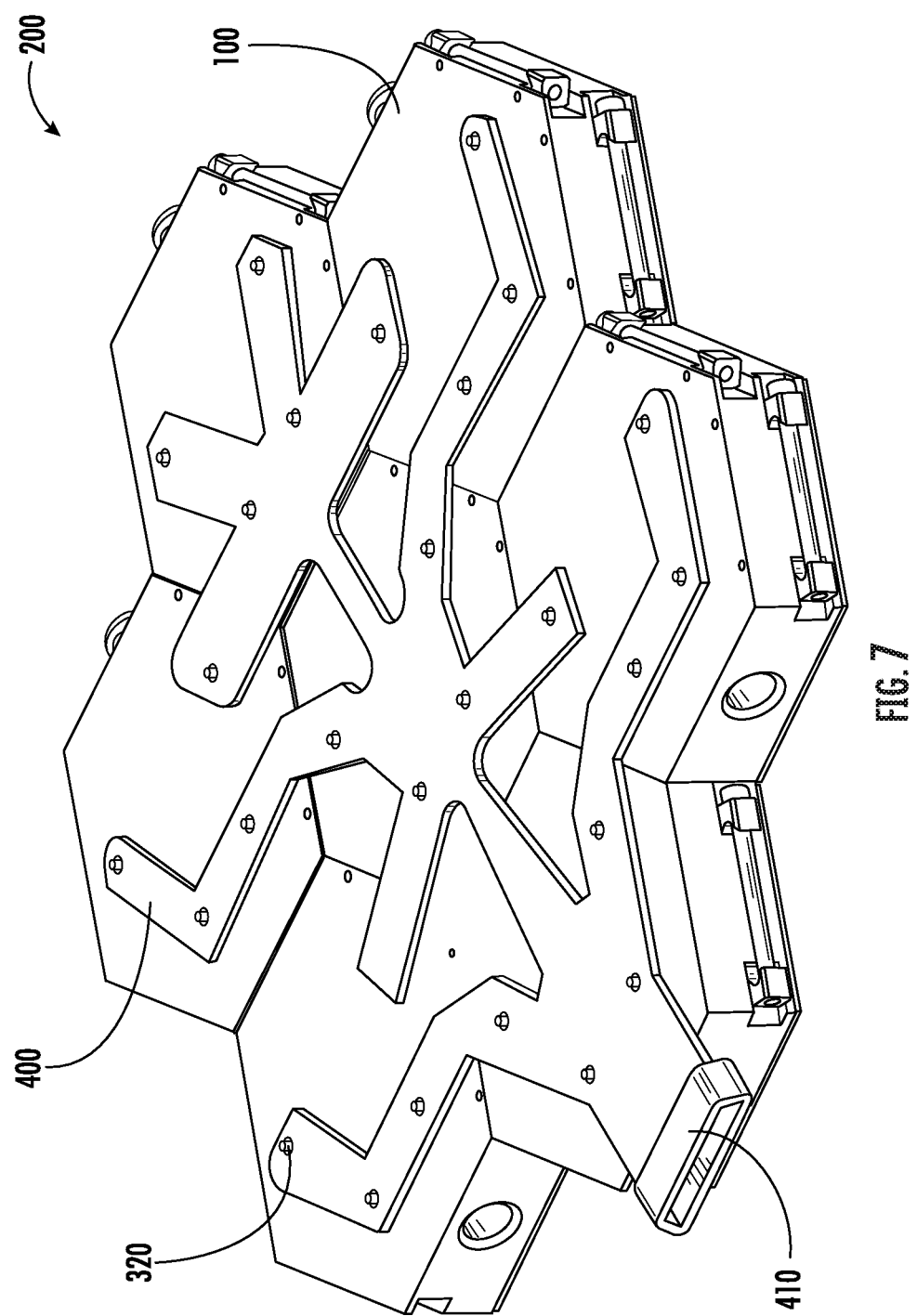
FIG. 7 shows a LED array with a flex circuit.

FIG. 7 shows the bottom surface of an array of modular LED heaters 100 (i.e. the side opposite the LEDs 310). A flex circuit 400 may be used to connect to a power connector 410 and route these signals to the back surfaces of the plurality of modular LED heaters 100. The flex circuit 400 may have female sockets to connect to the power feedthroughs 320 from each modular LED heater 100. A flex circuit is a thin dielectric material having a plurality of traces that are used to connect the power feedthroughs 320 to the power connector 410. In certain embodiments, the flex circuit is flexible and can be bent.

Thus, an LED array may be formed by assembling a plurality of modular LED heaters 100 in a plurality of rows, where each row has one or more modular LED heaters 100. As described above, the plumbing connections are automatically made between adjacent modular LED heaters 100 in a row, and the electrical connections are individually made to each modular LED heater 100 via the flex circuit 400. The ability to supply power independently to each modular LED heater 100 has additional benefits as described below.

As noted above, each modular LED heater 100 has power feedthroughs 320. In other words, each modular LED heater 100 may be powered at a power level independent of every other modular LED heater 100. For example, the modular LED heaters 100 near the outer edge of LED array 200 may be powered at a higher power level than those near the center of the LED array 200. Of course, the power level applied to each modular LED heater 100 is an implementation decision and is not limited by the present disclosure.

The modular LED heaters 100 nest together and provide an efficient packing density that provides uniform thermal response in the substrate when tuned correctly. The modular LED heaters 100 also provide a method to deal with the inherent tolerances associated with high volume LED production. Typical die from a given lot can vary +/−2% in light output. Designing a large LED heater with thousands of die that provides uniform light output, is quite troublesome. The modular LED heaters 100, each with several hundred die, can be calibrated in an integrating sphere. Each modular LED heater 100 is placed in the integrating sphere and a power output map is generated, wherein the output power vs. input power is mapped, as well as the temperature of the substrate. In certain embodiments, some modular LED heaters may also include an optional thermistor or RTD to monitor the substrate temperature. Thus, in some embodiments, a plurality of power output maps are created for each modular LED heater, where each power output map is generated at a different substrate temperature. The power output maps for each modular LED heater 100 may be loaded into control software so that a uniform power output can be provided for the entire LED array 200.

For example, control software may be used to control the input power to each of the modular LED heaters 100. The control software may be aware of the position of each modular LED heater 100 and its respective power output map. In one embodiment, the control software may then provide an input power to each modular LED heater 100 such that the output power of each modular LED heater 100 in the LED array 200 is the same. In another embodiment, the control software may then provide an input power to each modular LED heater 100 such that the output power of the LED array 200 meets some predefined pattern.

In one embodiment, off the shelf die that are not binned may be used. In this case, each modular LED heater 100 to be used in the LED array 200 is calibrated in the integrating sphere. This technique of calibrating each modular LED heater 100 also helps maintenance of the LED array 200. For example, if a modular LED heater 100 fails or starts to fail, it can simply be replaced instead of replacing the entire LED array 200. When one modular LED heater 100 is replaced, the power output map of that modular LED heater 100 is also replaced. This process may ensure that the light output from the entire LED array 200 remains uniform.

In certain embodiments, the LED array 200 is comprised of identical modular LED heaters 100. However, other embodiments are also possible. For example, in certain embodiments, the density of the LEDs 310 in certain modular LED heaters 100 in the LED array 200 may be less than other modular LED heaters 100. For example, the modular LED heaters 100 that form the center of the LED array 200 may have a lower LED density than the modular LED heaters 100 disposed near the outer edge of the LED array 200.

In certain embodiments, it may be desirable to create a LED array 200 that has a shape that cannot be created using a plurality of modular LED heaters 100. Further, it may be desirable to minimize the number of plumbing connections.

Figure 8A:
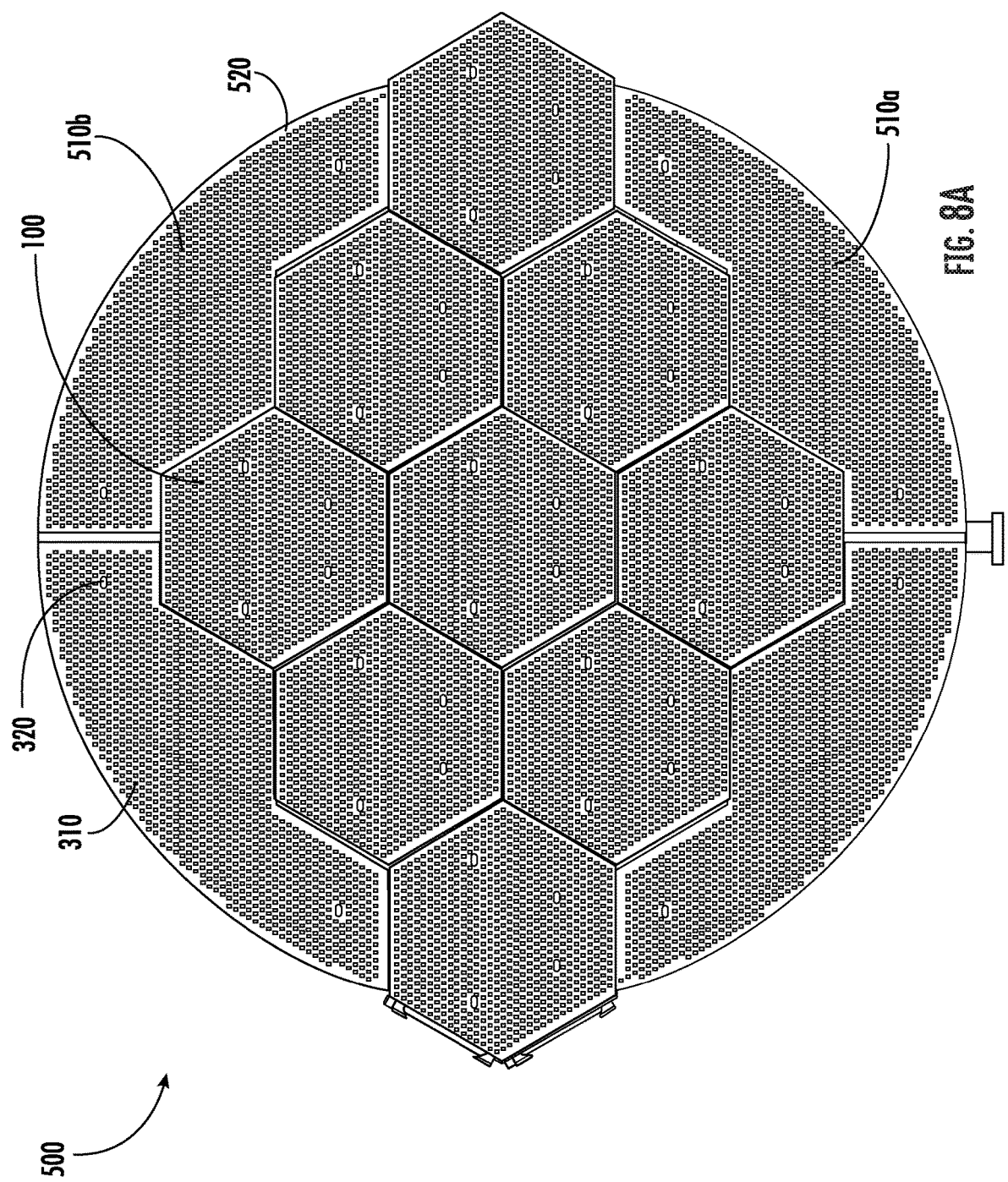
FIGS. 8A-8B show a LED array having headers.
Figure 8B:
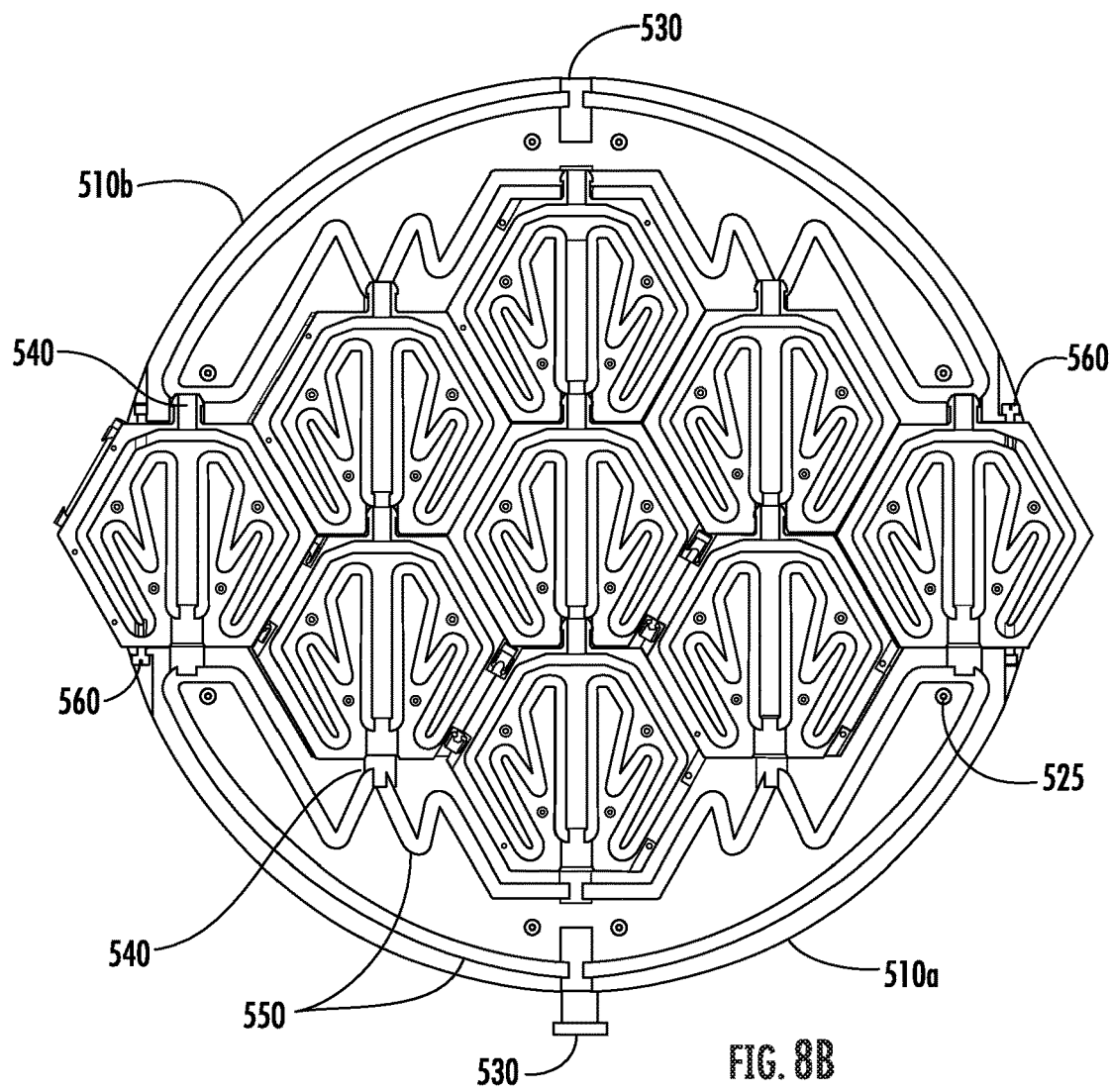

Therefore, in certain embodiments, a first header and a second header may be employed. FIG. 8A shows the front surface of a LED array 500 that includes a first header 510a and a second header 510b. FIG. 8B shows the LED array 500 without the printed circuit boards installed. As best seen in FIG. 8B, the LED array 500 includes five fluid paths, wherein each fluid path comprises a variable number of modular LED heaters 100. For example, in FIGS. 8A-8B, there are 3 modular LED heaters 100 in the center fluid path; 2 modular LED heaters 100 in the fluid path on each side of the center fluid path; and one modular LED heater 100 in the outermost fluid paths.

As can be seen in the FIGS. 8A-8B, the headers 510a, 510b are positioned at the front and rear of the fluid paths. Further, the shape of the headers 510a, 510b are such that they interconnect seamlessly with the modular LED heaters 100. Additionally, the headers 510a, 510b may also include a printed circuit board 520 with LEDs 310 and power feedthroughs 320, similar to the printed circuit boards 300 described above. The difference between the printed circuit board 520 for the headers 510a, 510b and the printed circuit board 300 for the modular LED heaters 100 may be the shape.

Figure 8C:
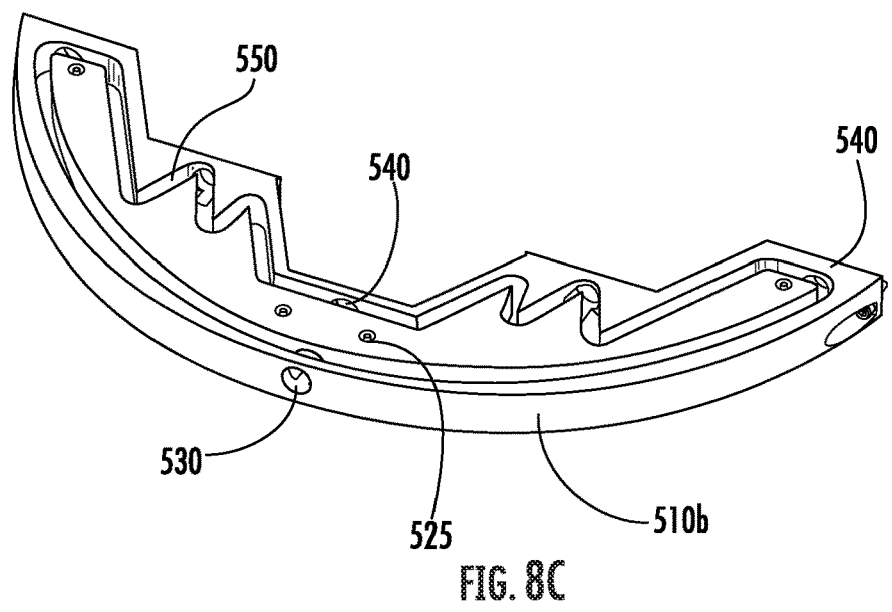
FIG. 8C shows the base used to form a header.

FIG. 8B shows the base of the headers 510a, 510b and a plurality of other bases 110. FIG. 8C shows the base of a header 510b. As can be seen, the first header 510a has an external plumbing port 530 and one or more internal ports 540. These internal ports 540 are configured to align with the plumbing ports 120 or the mating recessed ports 125 of a plurality of modular LED heaters 100, when the modular LED heaters are arranged as an array. In other words, the first header 510a has one external plumbing port 530 and a plurality of internal ports 540, where the number of internal ports 540 may be equal to the number of fluid paths in the LED array 500. The first header 510a also has a conduit 550 in communication with the external plumbing port 530 and the internal ports 540 to allow the flow of coolant fluid through the first header 510a and to the modular LED heaters 100. Thus, the first header 510a comprises a conduit 550 to supply coolant fluid from the external plumbing port 530 to each of the fluid paths in the LED array 500.

Screws 560 or other fasteners may be used to mechanically couple the first header 510a to the outermost modular LED heaters 100 in the LED array 500. Additionally, there may be one or more vertical channels 525 that pass from the front surface to the bottom surface. These vertical channels 525 may be used to pass electrical signals, such as power and ground to the printed circuit board that is disposed on the front surface of the base of the header.

Second header 510b is nearly identical to first header 510a, but may have different plumbing connections. For example, the first header 510a may be male connectors as the internal ports 540, while the second header 510b may be female connectors. Similarly, the external plumbing port 530 of the first header 510a may be a male connector and the external plumbing port 530 of the second header 510b may be a female connector. The second header 510b comprises a conduit in communication with each of the fluid paths in the LED array 500 to receive coolant fluid from each fluid path and route that coolant fluid to the external plumbing port 530.

Figure 9:
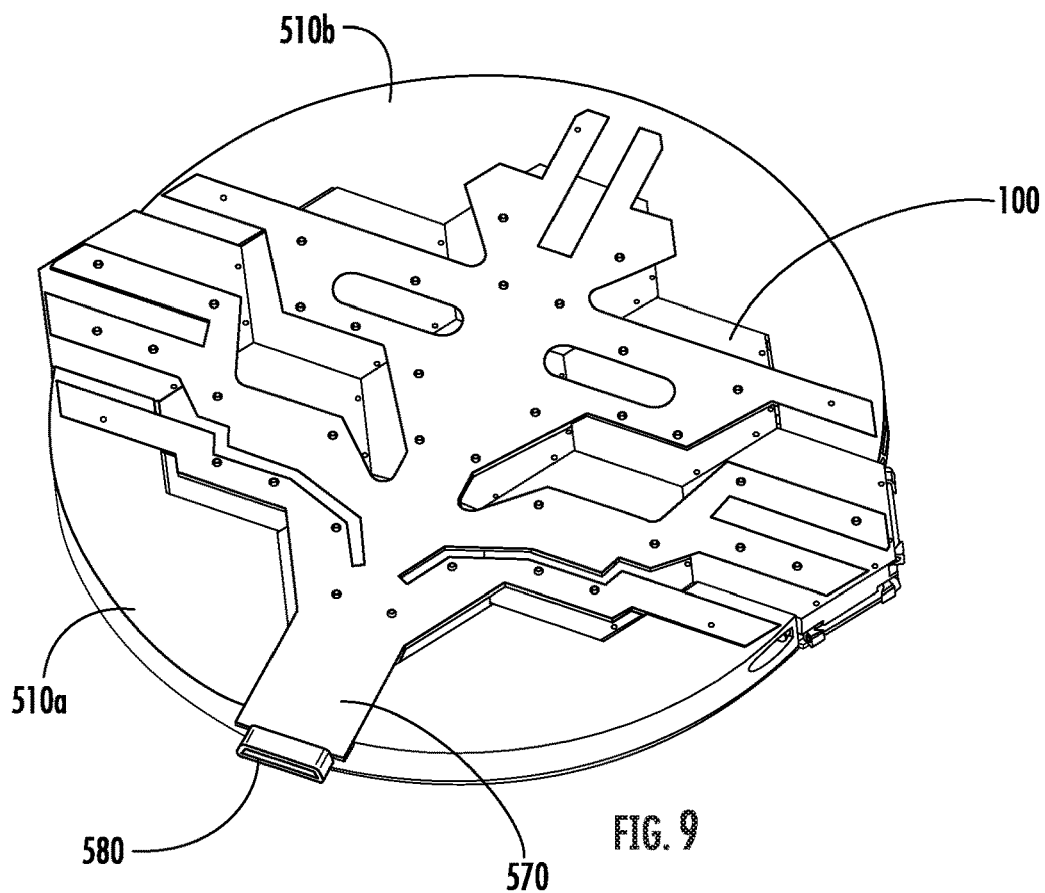
FIG. 9 shows the flex circuit used with the LED array of FIG. 8A.

Additionally, when headers 510a, 510b are used to create an LED array 500, the flex circuit may be modified to accommodate the power feedthroughs of the headers 510a, 510b. FIG. 9 shows such a flex circuit 570 having a power connector 580. The flex circuit 570 has connections to each modular LED heater 100 and each header 510a, 510b.

Figure 10:
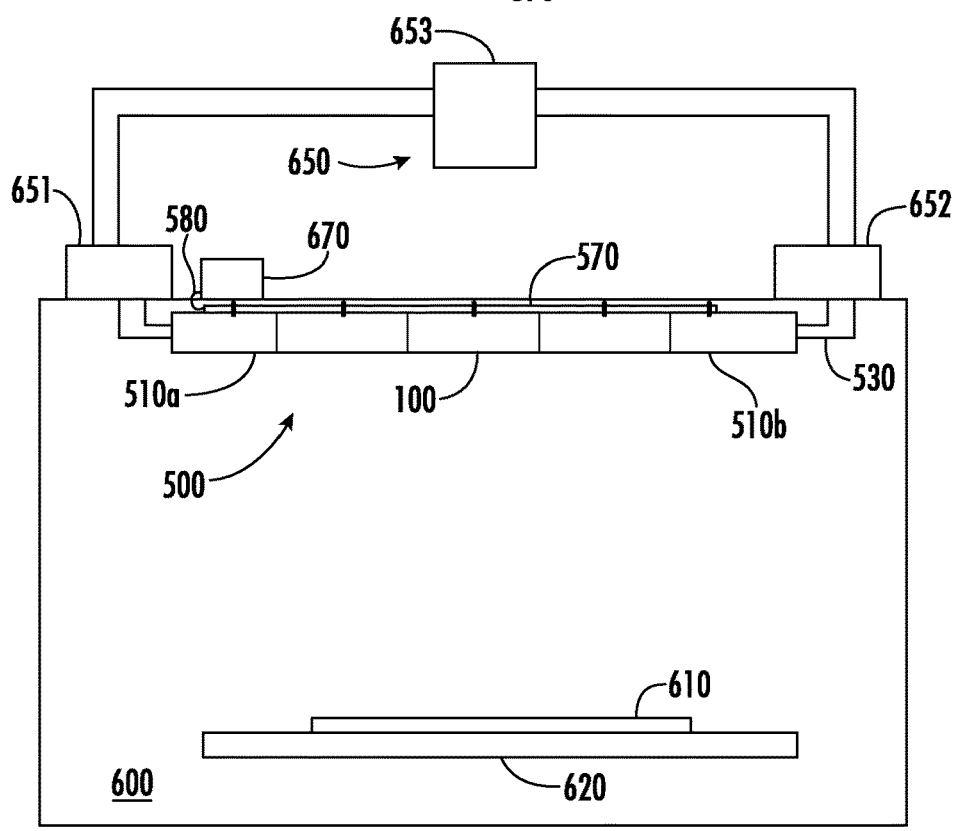
FIG. 10 shows a processing chamber using the LED array of FIG. 8A.

FIG. 10 shows a heating system using the LED array 500. The heating system comprises a processing chamber 600 which may be used to process a workpiece 610. In certain embodiments, the processing chamber 600 is used exclusively to heat the workpiece 610. In other embodiments, another semiconductor process, such as implantation, may also be performed in the processing chamber 600.

A LED array 500 comprising a plurality of modular LED heaters 100 may be disposed within the processing chamber 600. As shown in FIGS. 8A-8C, the LED array 500 may also comprise a first header 510a and a second header 510b. The workpiece 610 may be supported by a workpiece support 620. This workpiece support 620 may be movable. For example, the workpiece support 620 may be used to transport the workpiece 610 from a load lock or other port to its processing position. In other embodiments, the workpiece support 620 may be capable of vertical movement. In certain embodiments, the workpiece support 620 may be stationary.

The LED array 500 may be disposed on or near a top surface of the processing chamber 600. In some embodiments, the LED array 500 may be attached to the top surface of the processing chamber 600. In other embodiments, the LED array 500 may be supported in a different manner.

Disposed outside the processing chamber 600 is a cooling system 650, comprising a coolant fluid source 651 and a coolant fluid sink 652. In certain embodiments, the cooling system includes an external cooler 653 or heat exchanger to remove heat from the coolant fluid that exits the LED array 500. The coolant exiting the external cooler 653 can then be recirculated through the LED array 500.

A power controller 670 is also disposed proximate the top surface of the processing chamber 600. The power controller 670 comprises a processing unit and a memory device, wherein the memory device contains instructions that comprise the control software described above. The power controller 670 comprises a plurality of power supplies, each power supply adapted to connect to the power connector 580 of the flex circuit 570. The power supplied to each modular LED heater 100 and each header 510a, 510b may be determined using the power map described earlier.

The present system has many advantages. First, as described above, current LED arrays contain up to 8,000 LEDs. There is a reasonably small likelihood that all 8,000 LEDs function correctly and are properly soldered. Commonly, at least 1% of the LEDs are non-functional. Therefore, these arrays may be reworked to achieve thermal uniformity. Further, since all of the LEDs are on a single array, it is not possible to calibrate only a portion of these LEDs to insure thermal uniformity. Therefore, thermal uniformity is difficult to achieve. In contrast, the present system discloses a LED array made up of a plurality of modular LED heaters, which are designed to nest together, lock together and share plumbing connections. These modular LED heaters can be individually tested and characterized so that the input power to each modular LED heater can be customized for that heater. This allows better uniformity. Further, if one of the modular LED heaters fail, that modular LED heater is replaced while the rest of the modular LED heaters in the LED array remain in place. This reduces the cost of repair and rework.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A modular light emitting diode (LED) heater, comprising:
   a base having a conduit for coolant fluid to pass through, the conduit in communication with a plumbing port and a recessed port, wherein the plumbing port is adapted to enter into the recessed port of an adjacent modular LED heater;
   a printed circuit board disposed on a front surface of the base comprising a plurality of LEDs; and
   power feedthroughs, passing through the base and in communication with the printed circuit board to supply power to the LEDs.

2. The modular LED heater of claim 1, wherein the printed circuit board comprises a metal clad printed circuit board.

3. The modular LED heater of claim 2, wherein a top side of the conduit is a bottom surface of the metal clad printed circuit board.

4. The modular LED heater of claim 1, further comprising a flex circuit disposed on a back surface of the base and in electrical communication with the power feedthroughs.

5. The modular LED heater of claim 1, wherein the plurality of LEDs are separated into a plurality of zones, wherein each zone is powered by a dedicated power source.

6. The modular LED heater of claim 1, wherein the base is hexagonal.

7. The modular LED heater of claim 1, wherein a wedge clamp is disposed on at least one side wall of the base to lock the modular LED heater to an adjacent modular LED heater.

8. The modular LED heater of claim 7, wherein the at least one side wall comprises a screw channel, and the wedge clamp comprises:
   a first screw holder having a protrusion and a through hole;
   a second screw holder having a protrusion and a tapped hole; and
   a screw passing through the first screw holder and screwed into the second screw holder, wherein tightening of the screw locks the wedge clamp.

9. The modular LED heater of claim 8, further comprising vertical pins disposed in the screw channel, wherein tightening of the screw presses the protrusion against the vertical pins to lock the wedge clamp.

10. An LED array, comprising:
    a plurality of modular LED heaters, which are nested together, wherein each modular LED heater comprises:
    a base having a conduit for coolant fluid to pass through, the conduit in communication with a plumbing port and a recessed port;
    a printed circuit board disposed on a front surface of the base comprising a plurality of LEDs; and
    power feedthroughs, passing through the base and in communication with the printed circuit board to supply power to the LEDs;
    wherein the plumbing port of a modular LED heater enters the recessed port of an adjacent modular LED heater and forms a fluid-tight seal, wherein the modular LED heater and the adjacent modular LED heater form a fluid path.

11. The LED array of claim 10, wherein each modular LED heater comprises a wedge clamp disposed on at least one side wall of the base to lock each modular LED heater to an adjacent modular LED heater.

12. The LED array of claim 10, further comprising a flex circuit disposed on a rear surface of the LED array, wherein each power feedthrough is in communication with the flex circuit.

13. The LED array of claim 10, wherein the LED array comprises a plurality of fluid paths, each fluid path comprising at least one modular LED heater through which coolant fluid passes.

14. The LED array of claim 13, further comprising a first header and a second header, wherein the first header comprises an external plumbing port and a plurality of internal ports, wherein each internal port is in communication with a respective one of the plurality of fluid paths to supply coolant fluid to each fluid path, and wherein the second header comprises an external plumbing port and a plurality of internal ports, wherein each internal port is in communication with a respective one of the plurality of fluid paths to receive coolant fluid from each fluid path.

15. The LED array of claim 10, wherein the plurality of modular LED heaters are identical in size and shape.

16. A processing chamber, comprising:
    a workpiece support to hold a workpiece;
    a LED array disposed in the processing chamber, the LED array comprising:
    a plurality of modular LED heaters; wherein each of the plurality of modular LED heaters comprises:
    a base having a conduit for coolant fluid to pass through, the conduit in communication with a plumbing port and a recessed port, wherein the plumbing port of a modular LED heater enters the recessed port of an adjacent modular LED heater and forms a fluid-tight seal, wherein the modular LED heater and the adjacent modular LED heater form a fluid path;
    a printed circuit board disposed on a front surface of the base comprising a plurality of LEDs; and
    power feedthroughs, passing through the base and in communication with the printed circuit board to supply power to the LEDs;

and a cooler in communication with each fluid path to remove heat from the coolant fluid as it exits the LED array and recirculate the coolant fluid.

17. The processing chamber of claim 16, wherein the LED array further comprises:
- a first header, wherein the first header comprises an external plumbing port and a plurality of internal ports, wherein the external plumbing port is in communication with the cooler and each internal port is in communication with a respective one of a plurality of fluid paths to supply coolant fluid to each fluid path; and
- a second header, wherein the second header comprises an external plumbing port and a plurality of internal ports, wherein the external plumbing port is in communication with the cooler and each internal port is in communication with a respective one of the plurality of fluid paths to receive coolant fluid from each fluid path.

18. The processing chamber of claim 16, further comprising a flex circuit in electrical communication with each of the power feedthroughs and a power controller in electrical communication with the flex circuit, wherein the power controller controls power supplied to the LEDs in each modular LED heater.

19. The processing chamber of claim 18, wherein each of the plurality of modular LED heaters is calibrated and a power output map is generated for each of the plurality of modular LED heaters and the power controller uses the power output maps to control the power supplied to each modular LED heater.

20. The processing chamber of claim 19, wherein a plurality of power output maps are generated for each modular LED heater, and the power controller uses a temperature of the modular LED heater and the power output map to control the power supplied to each modular LED heater.

* * * * *